(12) United States Patent
Holmes et al.

(10) Patent No.: US 7,224,743 B2
(45) Date of Patent: May 29, 2007

(54) EFFICIENT DECODING OF TRELLIS CODED MODULATION WAVEFORMS

(75) Inventors: Michael J. Holmes, Long Beach, CA (US); Scott W. Enserink, Long Beach, CA (US); Jeffrey P. Long, Woburn, MA (US)

(73) Assignee: Northrop Grumman Corporation, Los Angeles, CA (US)

( * ) Notice: Subject to any disclaimer, the term of this patent is extended or adjusted under 35 U.S.C. 154(b) by 302 days.

(21) Appl. No.: 10/422,083

(22) Filed: Apr. 24, 2003

(65) Prior Publication Data

US 2005/0254605 A1 Nov. 17, 2005

(51) Int. Cl.
*H04L 23/02* (2006.01)
*H04L 5/12* (2006.01)

(52) U.S. Cl. .................. 375/265; 375/261; 375/341; 375/792; 375/795

(58) Field of Classification Search ............... 375/265, 375/341, 261; 714/792, 795
See application file for complete search history.

(56) References Cited

U.S. PATENT DOCUMENTS 6,233,712 B1 * 5/2001 Rhee et al. ................. 714/789
6,366,624 B1 * 4/2002 Balachandran et al. ..... 375/341

OTHER PUBLICATIONS

A.J. Viterbi et al., "A Pragmatic Approach to Trellis-Coded Modulation." Jul. 1989 IEEE Communications Magazine, pp. 11-19.
M.D. Ross et al., "Pragmatic Trellis Coded Modulation: A Hardware Implementation Using 24-Sector 8-PSK," ICC '92, pp. 1578-1582.
J.K. Wolf et al., "p2 Codes: Pragmatic Trellis Codes Utilizing Punctured Convolutional Codes," Feb. 1995 IEEE Communications Magazine, pp. 94-98.

* cited by examiner

*Primary Examiner*—Mohammed Ghayour
*Assistant Examiner*—Erin M. File
(74) *Attorney, Agent, or Firm*—Tarolli, Sundheim, Covell & Tummino LLP

(57) ABSTRACT

A method and apparatus for decoding trellis-coded digital data. Digital data samples that have been convolutionally encoded by trellis-coded modulation (TCM) for purposes of forward error correction require a computationally intensive Viterbi decoder for best performance. A technique known as pragmatic trellis-code modulation (PTCM) reduces decoder complexity but at the expense of degraded performance in some situations. This disclosure provides a solution that retains the reduced complexity of PTCM, but uses a full trellis approach that yields significantly better performance in terms of bit error rate (BER).

14 Claims, 11 Drawing Sheets

| Code Rate | Puncture Pattern |
|---|---|
| 1/2 | A[0]<br>B[0] |
| 2/3 | A[0], X<br>B[0], B[1] |
| 3/4 | A[0], X, A[2]<br>B[0], B[1], X |
| 4/5 | A[0], X, X, X<br>B[0], B[1], B[2], B[3] |
| 5/6 | A[0], X, A[2], X, A[4]<br>B[0], B[1], X, B[3], X |
| 6/7 | A[0], X, X, A[3], X, A[5]<br>B[0], B[1], B[2], X, B[4], X |
| 7/8 | A[0], X, X, X, A[4], X, A[6]<br>B[0], B[1], B[2], B[3], X, B[5], X | ced Modulation Waveforms

EFFICIENT DECODING OF TRELLIS CODED MODULATION WAVEFORMS

The U.S. Government has certain rights in this invention pursuant to FAR 52.227-12.

BACKGROUND OF THE INVENTION

The present invention generally relates to techniques for decoding of communication signals that have been encoded using convolutional coding. More particularly, the invention pertains to improvements in decoding signals that have been encoded using a coding technique generally known as trellis coded modulation (TCM). Communication of data through digital communication channels is subject to well known limitations. For communication channels involving orbiting satellites, there is an inherent transponder power limitation, given that a satellite must rely on batteries and solar power. In addition, rapid growth in data rate requirements have resulted in significant bandwidth limitations. Every communication channel is, of course, subject to unwanted noise interference. The effects of noise can be mitigated by employing higher transmitted power and greater bandwidth, but in a practical digital communication channel power and bandwidth are limited, so communication engineers have developed various techniques to correct digital data streams affected by noise. One measure of transmission channel performance is its transmission efficiency, measured in bits per second per Hertz, that is, the data transmission rate in bits per second, for each Hertz of bandwidth.

A widely accepted technique for increasing transmission efficiency is known as forward error correcting (FEC) coding. In essence, the principle of FEC coding is to generate redundancy in the data stream to be transmitted, such that each bit of data has an influence on the state of other adjacent bits of transmitted code. Given this inherent redundancy in the transmitted code stream, a receiver with an appropriate decoder can not only decode the received data but can correct errors in the received data based on reconstruction of the data using redundant information from adjacent bits. A detailed explanation, and even a simple example, of FEC coding is much more complicated than this simple statement of the principle.

FEC coding is often effected by means of a convolutional encoder, which, in its simplest form is a shift register and combinatorial logic that combines the binary states of selected stages of the shift register. The logic typically takes the form of exclusive-OR gates, each of which performs a modulo-two addition of its input bits. Data bits from each shift register stage are clocked not only to the next stage but into selected ones of the logic gates. Output data is clocked from selected logic gates. The rate of a convolutional encoder is defined as the ratio of its number of inputs to its number of outputs. For example, a convolutional encoder with two outputs for every input is referred to as a rate 1/2 encoder. Convolutional encoders may be designed to operate at other rates, such as 3/4, 4/5 and so forth. A convolutional encoder is also defined in part by its "constraint length," which is defined as the number of output bits affected by a given input bit (typically this value is one more than the number of shift register stages in the encoder) and by code generator polynomials. These may be expressed as binary or octal numbers that define the shift register connections to the modulo-two adders of the encoder.

A convolutional encoder may also be conveniently thought of as a state machine that changes state in response to a stream of input data bits. Consideration of the various changes of state that can occur in response to a data stream gives rise to a convenient graphical representation of the state machine, known as a trellis diagram. A trellis diagram is a rectangular matrix of dots. Each dot in the same row represents the same state, for example state 00, state 01, state 10, or state 11. Each column of dots represents possible states at a particular time instant. In a trellis diagram, if all possible state transitions from one time instant to the next are represented by diagonal or horizontal lines from one column of dots to the next, the result is a criss-cross pattern that resembles a trellis.

The trellis diagram format may also be used to depict the actual state transitions of a convolutional encoder when encoding a specific data stream. In this case, the diagram less resembles a trellis but shows in graphical form the succession of states assumed by the encoder during the encoding of a series of input data bits. The trellis diagram is key to understanding the decoding technique originally developed by Andrew J. Viterbi and referred to as Viterbi decoding. Encoding digital data convolutionally in the manner briefly described above and mapping the bit values onto an expanded signal constellation so that the free Euclidean distance is maximized is the essence of trellis coded modulation (TCM).

It will be appreciated that, even in a simple case of an encoder using just a few stages, the trellis diagram is computationally complex. A more useful encoder would have a larger constraint length, such as seven, and the encoder would have $2^6$ or 64 states. The corresponding trellis diagram and the Viterbi decoding algorithm are complex and cumbersome in the extreme. Efforts to simplify TCM decoding led to a method known as pragmatic trellis-coded modulation (PTCM), described in a paper by Andrew J. Viterbi et al., entitled "A Pragmatic Approach to Trellis-Coded Modulation," July 1989 IEEE Comm. Magazine, pp. 11-19.

The design of TCM encoders and decoders for optimum performance depends in part on the type of data modulation employed. The PTCM technique proposed in the Viterbi et al. paper is an approach that permits a single basic encoder and decoder using a rate of 1/2 and a constraint length of seven, to be applied to various modulation schemes. Digital modulation schemes using phase and/or amplitude modulation are generally defined by signal constellations, i.e., graphical representations of the possible signal phases and amplitudes used to represent various data states. The PTCM technique is said to be applicable to a wide variety of signal constellations. Prior to the Viterbi et al. paper, G. Ungerboeck showed in a paper entitled "Channel Coding with Multilevel/Phase Signals," IEEE Trans. on Info. Theory, vol IT-28, pp. 55-67, January 1982, that it was possible to achieve Asymptotic Coding Gains (ACGs) of as much as 6 dB within precisely the same signal spectral bandwidth, by doubling the signal constellation set from $M=2^{k-1}$ symbols to $M=2^k$ symbols, employing a rate (k-1)/k convolutional code, and mapping the bits onto the signal constellation in such a way that the free Euclidean distance of the resulting trellis was maximized. The Viterbi et al. paper pointed out that there were a number of drawbacks to the Ungerboeck approach, as subsequently refined by others. First, each signal configuration seemed to require a different convolution code, and no single encoder-decoder could be used for a wide set of parameters. Second, the Ungerboeck approach suffered from the practical limitation that the number of trellis code states used in most application was very low, typically four or eight, and rarely more than sixteen. Finally, performance in the Ungerboeck model was always to be measured by ACG, which is a function of free Euclidean distance. Viterbi et al. believed that using free Euclidean distance to measure performance would lead to misleading results because not only may there be a large number of paths at the same distance, but also the next higher Euclidean distance between unmerged paths may be only a very small amount larger than the free distance.

In summary, Ungerboeck determined the optimal convolutional code for several TCM modulation types. Then, Viterbi et al. showed that in most cases the de facto industry standard encoder (with constraint length 7, rate 1/2 and generator polynomials $171_8$ and $133_8$) could be used along with a technique known as "puncturing" to perform the convolutional coding with little or no loss in bit error rate (BER) performance in many situations. In the puncturing technique, selected bits of the encoder output stream are discarded, resulting in a higher effective code rate. For example, if one output bit in every four from a rate 1/2 encoder is discarded, the encoder effectively outputs three bits for every two input bits and effectively functions as a 2/3 encoder. If two bits of each group of six output bits are discarded, the encoder produces four output bits for each set of three input bits and effectively functions as a 3/4 encoder. When the encoded data stream is punctured in this manner, the data stream received and decoded must be "de-punctured" to supply the discarded data. Typically, de-puncturing is effected by inserting median values that do not affect the decoding process.

Although PTCM decoding techniques represent a practical advantage over earlier convolution encoding and decoding methods, puncturing and de-puncturing the code necessarily results in diminished BER performance. A return to the earlier approach of performing a "full-rate" trellis decoding operation, without puncturing and de-puncturing of the code, presents an extraordinary increase in computational complexity, even at the standard constraint length of seven bits. Accordingly, it would be highly advantageous to provide a convolutional encoding and decoding approach that retains the simplifying advantages of the PTCM approach, but does not result in lowering of the BER performance. The present invention is directed to this end.

SUMMARY OF THE INVENTION

The present invention retains most of the advantages of the pragmatic trellis coded modulation (PTCM) technique but provides improved performance by virtue of the use of a full-rate trellis decoder. Briefly, and in general terms, the method of the invention comprises the steps of receiving digital data for a received signal constellation point as one or more pairs of in-phase (I) and quadrature (Q) values; calculating soft decision values corresponding to each received pair of (I,Q) values that defines a set of n least significant bits of received data, where n is the number of bits of data that were subject to encoding by TCM; calculating multiple branch metric values for use in the decoding process, from the soft decision values; Viterbi decoding n bits of data at a time using the multiple branch metric values, and producing n bits at a time of output data; re-encoding the n bits at a time of output data to determine what limited set of signal constellation symbols each received (I,Q) value is associated with; using the re-encoded data to process uncoded data bits in a hard decision process to recover multiple uncoded bits of received data; and assembling the recovered uncoded bits of received data with the n bits of decoded data output from the Viterbi decoding step, to provide a complete data symbol. Importantly, the Viterbi decoding step employs a full-rate trellis, without de-puncturing the code, and thereby achieves improved performance as measured by bit error rate (BER).

The method, and corresponding apparatus, of the invention provides a similar level of simplicity as the well known pragmatic trellis coded modulation (PTCM) technique, but with improved performance. Moreover, the decoder of the invention operates with a variety of modulation constellations without modification, except by changing values stored in tables for the coordinates of the constellation points. Other aspects and advantages of the invention will become apparent from the following more detailed description, taken in conjunction with the accompanying drawings.

DETAILED DESCRIPTION OF THE PREFERRED EMBODIMENTS

Figure 1:
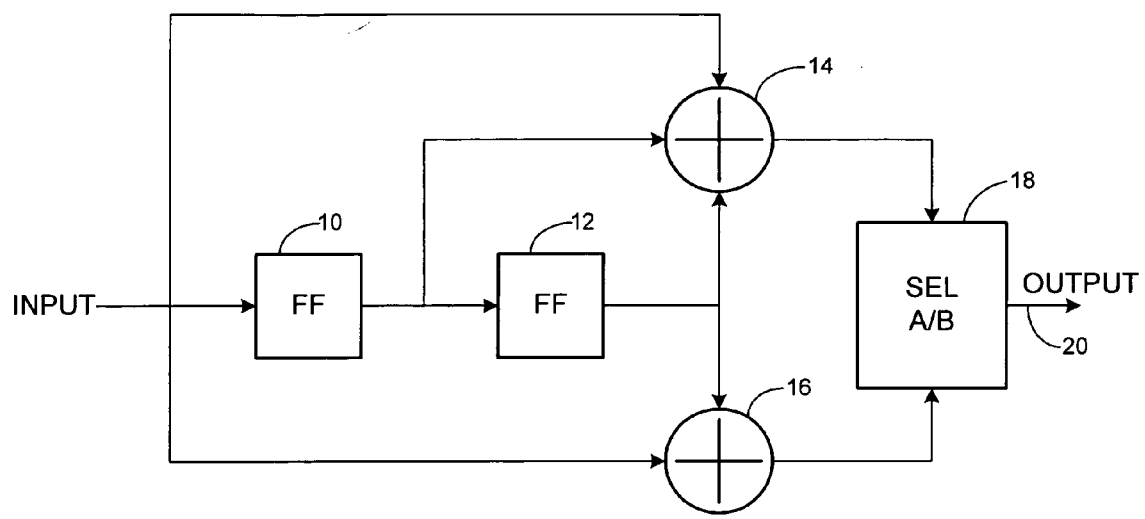
FIG. 1 is a block diagram of a rate 1/2 encoder having a constraint length of three.

As shown in the drawings for purposes of illustration, the present invention pertains to an improved technique for decoding digital information signals that have been encoded by trellis coded modulation (TCM). In TCM, which is a form of forward error correction (FEC) encoding, digital signals are convolutionally encoded to contain redundant information. The encoded and uncoded bits are mapped onto the signal constellation in such a manner as to maximize free Euclidean distance. Data signals so encoded are less susceptible to distortion by noise in a communication channel. During decoding at the receiving end of the communication channel, the redundant information is used to recover the original data, even if some of the data bits are erroneous or missing from the data stream.

Although the process of convolutional encoding is relatively simple to implement in hardware or software form, decoding TCM signals is computationally complex. A modified form of TCM known as pragmatic TCM, or PTCM, has been widely adopted because it has reduced the complexity of decoding, but at a cost of degraded performance in some situations.

In accordance with the invention, an improved TCM decoding technique is provided, having most of the desired simplicity of PTCM but with significantly enhanced performance. More details of the invention are provided after first summarizing the conventional TCM encoding and decoding processes.

Basics of Convolutional Encoding:

The computational complexity of Viterbi decoding can be appreciated by considering a very simple case in which encoding is performed by a rate 1/2 convolutional encoder having a constraint length of 3, i.e., employing a two-stage shift register, such as the one shown in the encoder of FIG. 1. This encoder has two flip-flops 10 and 12 and two modulo two adders 14 and 16. An input at k bits/second is applied to the first flip-flop 10 and simultaneously to the adders 14 and 16. The output of the first flip-flop 10 is applied to the second flip-flop 12 and simultaneously to the first adder 14. The output of the second flip-flop 12 is applied to the first and second adders 14 and 16. The outputs of the adders 14 and 16 are selected alternately by a selector switch 18, operating at a rate that results in an output stream on line 20 at a rate n=2 k, twice the input rate.

Figure 2:
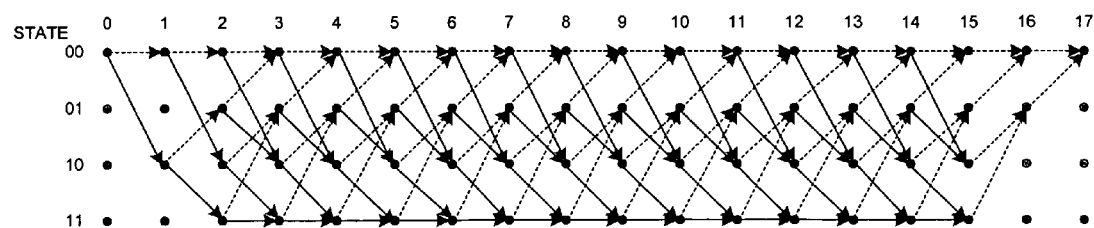
FIG. 2 is a trellis diagram corresponding to the encoder of FIG. 1, showing all possible state transitions of the encoder.

Because the encoder has two bits of memory, it may be considered to be a state machine with four possible states, 00, 01, 10 and 11. The trellis diagram for such an encoder is shown in FIG. 2. It has four rows of dots, corresponding to the four possible states of the encoder memory, and a column of dots for each time instant under consideration, seventeen of which are shown. The solid lines between dots indicate the state transitions that occur when the input bit is a one. The dotted lines between dots indicate the state transitions that can occur when the input bit is a zero. For example, it will be seen that a one input will cause a transition from state 00 to state 10, or a transition from state 01 to state 10, or a transition from state 10 to state 11, or finally, a "transition" from state 11 to state 11. Similarly, a zero input will cause a transition from state 00 to state 00, state 01 to state 00, state 10 to state 01, or state 11 to state 01.

Figure 3:
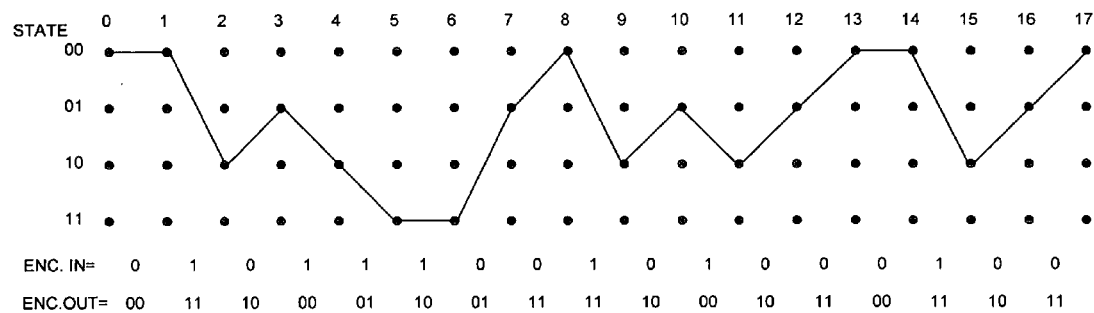
FIG. 3 is a trellis diagram corresponding to the encoder of FIG. 1, showing only actual state transitions for a sample data stream.

FIG. 3 is a trellis diagram showing the states of the trellis that are actually reached during the encoding of a 15-bit data stream indicated at the bottom of the figure. Also indicated at the bottom of the figure is stream of encoder output signal pairs (recalling that each input signal bit results in a pair of output bits for this encoder type). Because the communication channel is not perfect, each pair of bits generated by the encoder may not be accurately received at the receiver end of the channel. The essence of the decoding process is to recreate the data input stream from the output symbol pairs detected at the receiver end of the channel. (This statement tacitly assumes that decoding uses a "hard" decision process to determine either a one or a zero data bit at the receiver. As will be discussed later, many practical decoders use a "soft" decision process in which probabilities are associated with a detected bit decision.) In the example discussed above, decoding requires the computation of an error metric each time a pair of channel symbols is received. The metric is selected to provide a measure of the "distance" between a received signal pair and all possible channel symbol pairs that could have been received. For example, in going from t=0 to t=1, there are only two possible channel symbol pairs that could have been received: (1) A receipt of a zero input bit, indicates that the encoder state stayed at 00 and that the encoder output was 00. (2) A receipt of a one input bit, indicates that the encoder state transitioned to 10 and the encoder output was 11. The encoder is assumed to have been initialized to an all-zero state, and one input of one or zero results in only two possible outputs. The metric can be any convenient distance measure. In this example the Hamming distance is used, and is defined simply as the number of bits that are found to be different when comparing the received channel symbol pair and other possible channel symbol pairs. For a two-bit symbol pair, this Hamming value can only be zero, one or two. For the first time instant under consideration, the received symbol pair was 00 and the possible symbol pairs are 00 and 11. Thus, the corresponding Hamming distances to these pairs are 0 and 2, respectively, and these values are stored as an accumulated error metric associated with states 00 and 10, respectively.

For the next time instant, from t=1 to t=2, a channel symbol pair of 11 was received and the possible symbol pairs that could have been received are 00 (going from state 00 to state 00), 11 (going from state 00 to state 10), 10 (going from state 10 to state 01), and 01 (going from state 10 to state 11). The corresponding Hamming distances to the actually received pair or 11 are two, zero, one and one, respectively. The error metrics accumulated for each state (00, 01, 10 and 11) are two, three, zero and three respectively.

At the next time instant, t=3, there are two different ways or branches to transition from each of the four states at t=2 to the four states at t=3, giving a total of eight possible branches. Each of two branches leading to a state at t=3 may have a different associated error metric, so the process must deal with this in some way. For example, the larger error metric of the two paths leading to a state may be discarded or, if the two error metrics are equal, a selection is made by coin toss or consistently picking the upper or lower branch. This process is continued from time instant to time instant through the trellis, and it will be noted that the actual transmitted message is associated with the smallest accumulated error metric.

The Viterbi decoder utilizes the accumulated error metric data and a history of which states preceded the states with the smallest accumulated error metric at each time instant. Starting at the end of the trellis diagram, with the state having the lowest accumulated error metric, a simple form of the algorithm works backwards through the trellis diagram to perform a "traceback" operation. The state history table is utilized to provide the predecessor of each successive state with the lowest accumulated error metric. From this list of states, which represent the actual data points on the trellis diagram, the input data bits are recovered by using a table that relates how each input affects transitions between states. It will be understood from this simple example that decoding of TCM data symbols in a practical configuration is much more complex.

Figure 4:
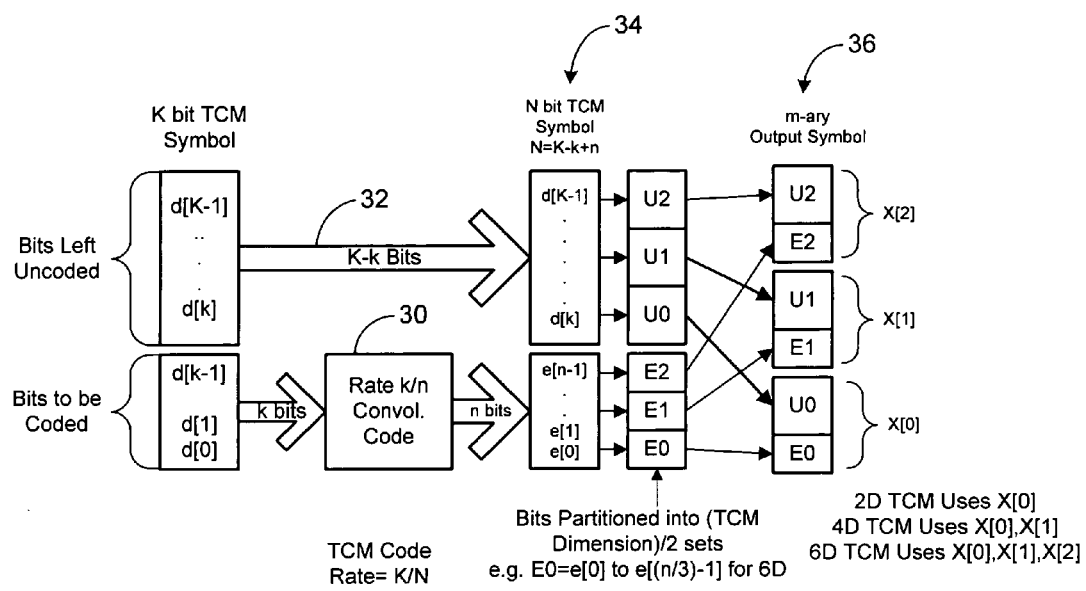
FIG. 4 is a block diagram of generalized scheme for pragmatic trellis code modulation (PTCM).

Typical TCM Encoding:

FIG. 4 shows how a TCM input symbol (K bits) is convolutionally encoded and mapped to m-ary output symbol(s) in a typical encoder configuration of the prior art. K is the total number of bits in a TCM input symbol and N is the total number of bits in a TCM output symbol. Lowercase k and n denote the number of input and output bits processed by a convolutional encoder, indicated at 30. Encoding begins by decomposing the K-bit input symbol into two sets of bits. The least significant k bits are sent to the rate k/n convolutional encoder 30. The remaining K-k bits, as indicated at 32, are combined with the n-bit output of the encoder, as indicated at 34. Then the n-bit portion and the (K-k)-bit portion are each partitioned, as indicated at 36, into equal numbers of sets. Numerically, the number of sets is equal to half of the TCM dimension. A receiver that receives TCM symbols that are each defined by a single pair of I and Q values is said to be two-dimensional (2D). If two pairs of (I,Q) are received per TCM symbol, the TCM is said to be four-dimensional (4D), three pairs means six-dimensional (6D) Partitioning is illustrated or the 6D case, there being three sets for the coded and uncoded bits. Finally, as indicated at 36, these sets are mapped to m-ary constellation symbols so as to produce maximum free Euclidean distance, which are then fed to a modulator (not shown in this figure), as indicated by the arrows in the figure. The number of encoded bits assigned to each signal constellation symbol, depends in part on whether two-dimensional (2D), four-dimensional (4D) or six-dimensional (6D) TCM is employed.

Figure 5:
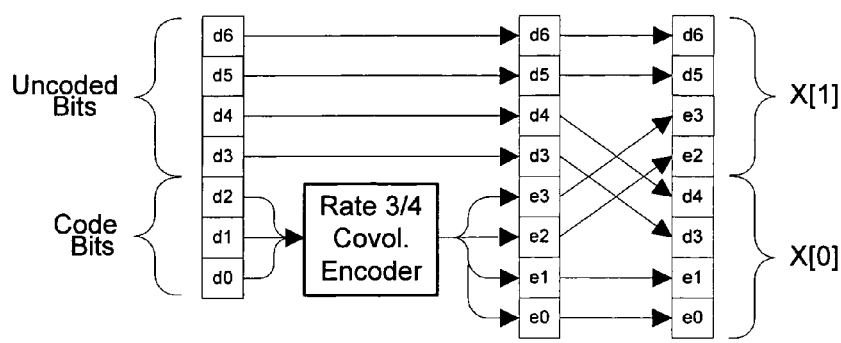
FIG. 5 is a more specific diagram similar to FIG. 4.
Figure 6:
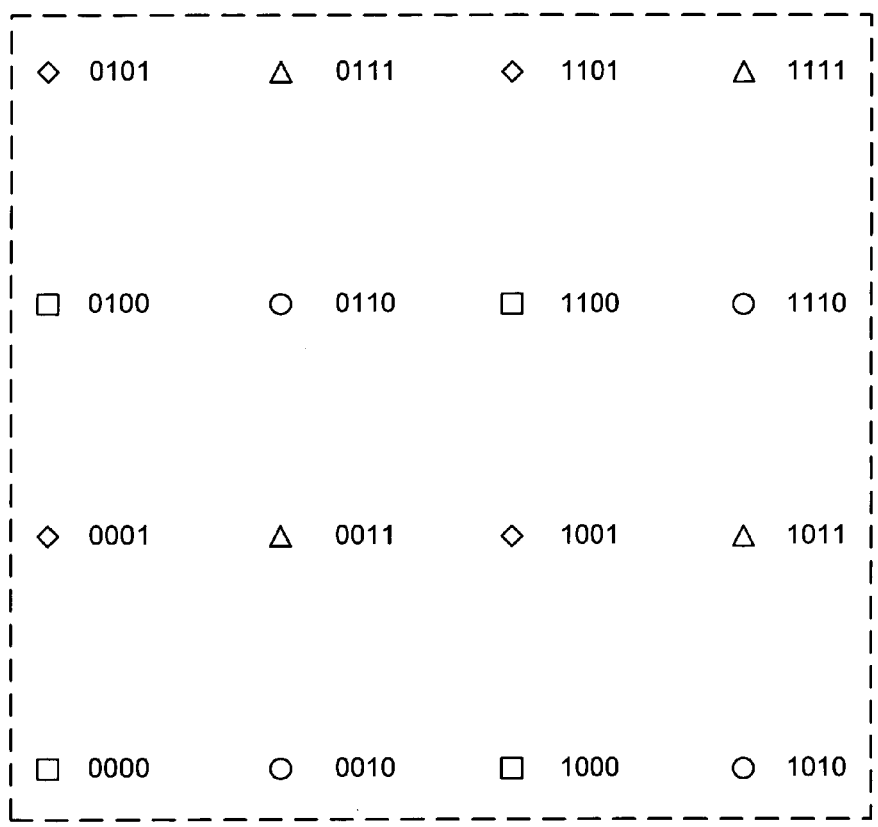
FIG. 6 is a signal constellation diagram applicable to the encoder of FIG. 5.

FIG. 5 is an exemplary form of FIG. 4, specifically for the case of a 7-bit input symbol (bits d0 through d6) and using a rate 3/4 convolutional encoder. Three bits of each input symbol are encoded to provide four output bits (e0 through e3), which are combined with the uncoded bits (d3 through d6) of the input symbol. In set partitioning the 16-ary signal constellation is divided into four sets of constellation symbols defined by the two coded bits. The symbol indicated by X[0] includes coded bits e0 and e1 and uncoded bits d3 and d4. The symbol indicated by X[1] includes coded bits e2 and e3 and uncoded bits d5 and d6. FIG. 6 shows how these symbols could be mapped to a constellation of 16 QAM (quadrature amplitude modulation) points. In this map, the two least significant bits (LSBs) of a 16-ary symbol denote the particular coset and the most significant bits (MSBs) identify a member within a coset. For example, the codes 0101 and 0001 are members of the same coset (ending in 01) and are also indicated by the same graphical symbol (a diamond). Similarly, all the codes indicated by a triangle are in the same coset, as are all those indicated by a square and all those indicated by a circle. It will be observed that the minimum distance between members of the same coset is maximized. Ideally, for optimal TCM code performance constellations must be mapped in this manner. In addition, members within the same coset should be "gray coded" as much as possible. That is, adjacent members of the same coset should differ by as few bits as possible.

Figures 7, 8:
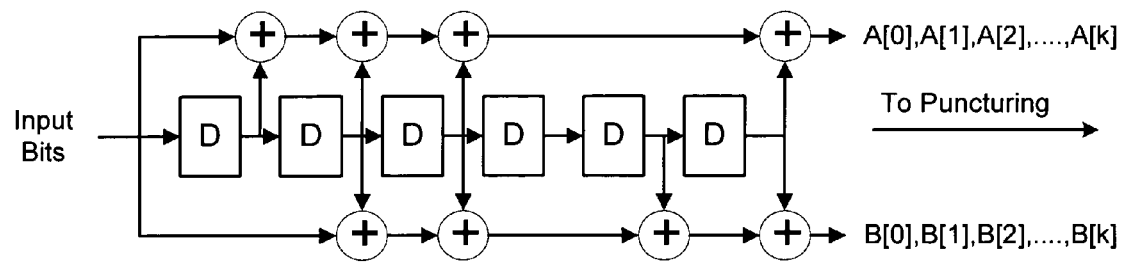
FIG. 7 is a block diagram of a convolutional encoder of having a code rate of 1/2 and a constraint length of seven.
FIG. 8 is a table illustrating the principle of puncturing.

Most commercial off the shelf type of Viterbi decoders will only decode using the de facto standard constraint length of seven and a rate of 1/2 . For completeness, a convolutional decoder of this configuration is shown in FIG. 7. It will be observed that the decoder has six stages, indicated by flip-flops D, connected serially, and a total of seven modulo-two adders, each indicated conventionally by a circle with a "+" symbol in it. The final pairs of modulo-two adders provide A and B outputs that represent logical combinations of the various stages of the encoder. As is conventional, these combinations are expressed as polynomials $G_1$ and $G_2$, where $G_1=171_8$ and $G_2=133_8$. The first polynomial (1 111 $001_2$) indicates that the A output is a logical combination of the input bit, the first through the third stages and the last stage of the encoder shift register. The other polynomial (1 011 $011_2$) indicates that the B output is a logical combination of the input bit, the second and third stages, and the fifth and sixth stages of the encoder shift register.

As indicated in FIG. 8, the A and B outputs of the encoder of FIG. 7 may be combined in various ways to select an effective code rate. If the A and B output bits are both selected at all times, the result is a rate 1/2 encoder. If, however, selected A and B bits are discarded, as indicated by the X symbols in the figure, the encoder effectively operates at another selected code rate. For example, if every other A bit is discarded, the encoder produces three bits for every two input bits, resulting in a code rate of 2/3 . Similarly, as shown in the figure, if both an A bit and a B bit are discarded for every third input bit, the result is the output of four bits for every three input bits, a code rate of 3/4 results. Other patterns of discarded bits may be employed to produce effective code rates of 4/5, 5/6, 6/7 or 7/8, as shown in the figure. The arrangement of used bits in the final n-bit output is somewhat arbitrary so long as both encoder and decoder follow the same assignments.

Figure 9:
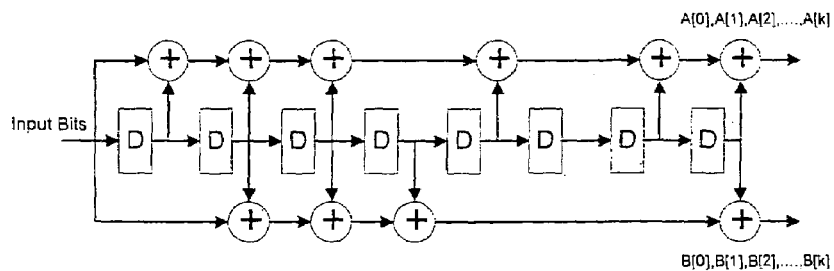
FIG. 9 is a block diagram of a convolutional encoder of having a code rate of 1/2 and a constraint length of nine.

In addition to the constraint length 7 code, there is an industry standard rate 1/2 constraint length 9 code, with polynomials $G_1=753_8$ and $G_2=561_8$. This encoder is used in the preferred embodiment of the present invention and is shown in FIG. 9. Since this encoder is theoretically known, the figure is indicated as being "prior art." However, the use of a constraint length 9 encoder is believed to be novel because prior to the present invention no such usage has been reported in published journal articles.

Use of Soft Decision Values in Decoding:

In the description up to this point, it has been assumed that decoding is a "hard" decision process, meaning that it is one in which the decoder estimates the binary values of received data bits and assigns logical "1" or "0" values to them. The following narrative explains the "soft" decision process, wherein receive bits have an associated reliability or likelihood of being one logical state or another.

In the description that follows, it is assumed that there are at most two coded bits, $C_1$ and $C_2$, associated with each constellation symbol. The decoding methods described below can easily be generalized to other situations. The pragmatic trellis coded modulation (PTCM) decoding algorithm makes use of soft decision values, which are labeled $g_1$ and $g_2$. The soft decision value $g_1$ is associated with coded bit $C_1$ and the soft decision value $g_2$ is associated with coded bit $C_2$. A soft decision value represents a measure of the reliability, or likelihood, that a coded bit associated with a received (I,Q) value, which itself represents a constellation symbol sample value, represents a logic '1' or a logic '0'. One method of calculating this reliability value is the log-likelihood ratio (LLR) method in which the logarithm of a probability ratio is used as the reliability measure, $$g1(I,Q)=ln[P((I,Q)|c1='1')/P((I,Q)i|c1='0')] \text{ and}$$

$$g2(I,Q)=ln[P((I,Q)|c2='1')/P((I,Q)i|c2='0')]$$

If, for example, the $g_1$ and $g_2$ values are represented by 4 bits, then a value of 15 for $g_n$ would indicate complete assurance that the received (I,Q) value represents a logic '1' for coded bit $C_n$; a value of 0 would indicate complete assurance that the received (I,Q) represents a logic '0'; and a value of 7.5 would represent a situation in which it is just as likely that the received (I,Q) value represents a logic '1' as it is that it represents a logic '0'. There are methods other than the LLR method of calculating these soft decisions. The LLR method is just one example.

Figure 10:
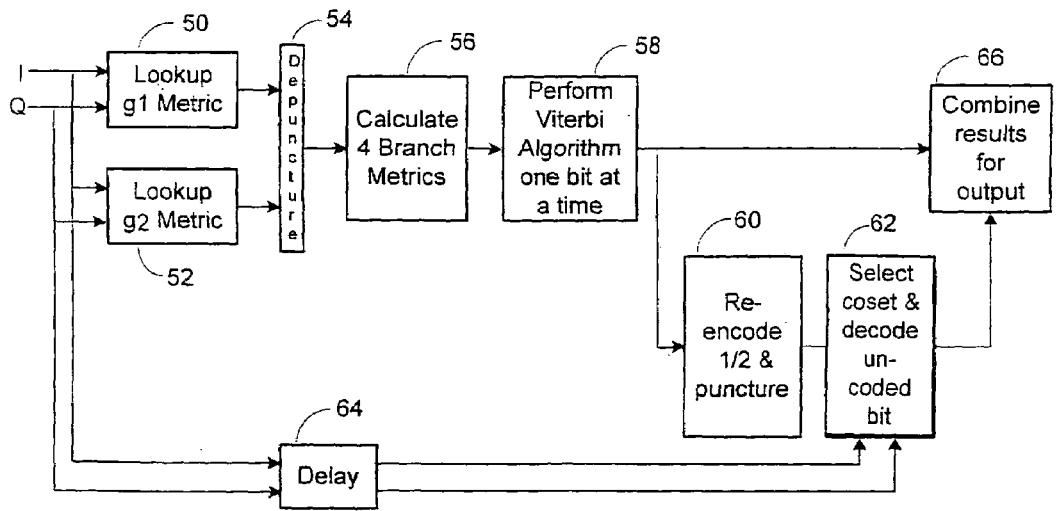
FIG. 10 is a block diagram of a PTCM decoding scheme of the prior art.

Traditional PTCM Decoding Algorithm:

A typical PTCM decoder is shown in FIG. 10. The steps of the typical PTCM decoding algorithm are described below. Please note that this description assumes that there are no more than two coded bits per constellation symbol, the algorithm is applicable to other situations as well:

(1) The I/Q samples for the received constellation symbols are read in from an analog-to-digital converter (not shown in the figure) and are processed in a serial fashion. One pair of I/Q samples is processed to produce a $g_1$ and $g_2$ soft decision metric, as indicated in blocks 50 and 52.

Figure 11:
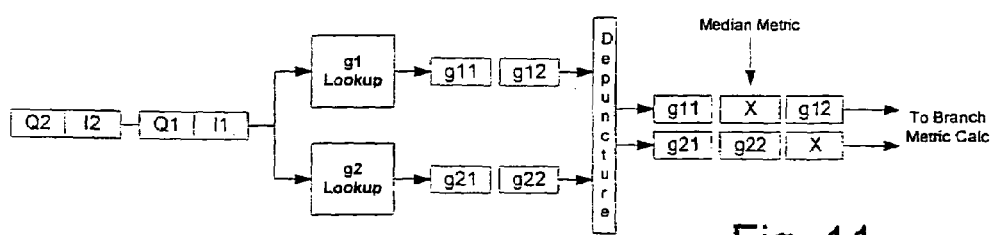
FIG. 11 is a block diagram of a portion of FIG. 10, illustrating the principle of de-puncturing.

(2) Depending on whether the TCM code is a 2-D, 4-D, or 6-D code these $g_1$ and $g_2$ metrics are next de-punctured, as indicated at 54. In de-puncturing, the previously discarded symbols (in the encoder) are replaced with median metrics (erasure values) that will not influence the decoding one way or another. FIG. 11 shows by way of example the de-puncturing process for a 4-D TCM code that uses a 3/4 convolutional code.

(3) Each of these $(g_1,g_2)$ pairs is then used to calculate a set of four branch metrics, as indicated at 56, corresponding to trellis transitions that have 00, 01, 10 and 11 output bits.

(4) These four branch metrics are then used, as indicated at 58, in the Viterbi algorithm to decode one bit at a time. For the rate 3/4 case, it will take three iterations of the Viterbi algorithm to decode the coded bits of an entire TCM symbol.

(5) The decoded bits output by the Viterbi algorithm are then re-encoded and re-punctured, as indicated in block 60, in the same way as was done in the encoder. For example, for the rate 3/4 case, one bit will encode to two bits and so three bits will encode to six bits, but will be punctured to two sets of two bits, or four bits total.

(6) Each of these sets of two bits corresponds to one of the pairs of I/Q data that was originally input to the decoder. Each set of two bits will tell us which coset the original I/Q pair should have come from. By performing a hard decision minimum distance decode to the closest member within the determined coset, the uncoded bits represented by an (I,Q) value are determined, as indicated in block 62. The uncoded bits are delayed, as indicated by block 64, to synchronize them with the coded bits.

(7) The final step is to assemble the coded bits and uncoded bits, as indicated in block 66, to form the final TCM K-bit symbol.

Figure 15:
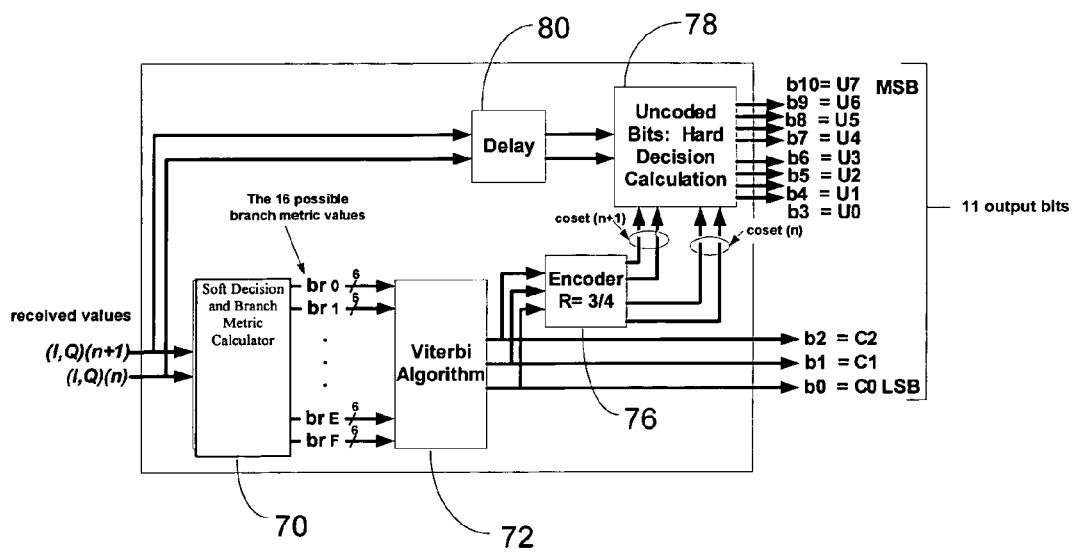
FIG. 15 is block diagram of the TCM decoding technique of the present invention.

Improved TCM Decoder:

The inventive decoder processes the signal in much the same way as a PTCM decoder, in the sense that the coded and the uncoded bits are processed separately. Thus it maintains much of the simplicity of a PTCM decoder. However, instead of using a rate 1/2 decoder with the associated de-puncturing, it improves performance by utilizing a full-rate trellis which allows it to circumvent one of the performance degradations that puncturing introduces. The nature of this improvement is described below after an example of a method for calculating the soft decision values is given. In the description that follows, it is assumed that there are at most two coded bits, $C_1$ and $C_2$, associated with each constellation symbol. The inventive decoding method described below can easily be generalized to other situations. FIG. 15 provides a block diagram of one example of the inventive decoder.

Calculation of Soft Decision Values:

The inventive decoding algorithm also makes use of soft decision values, but the soft decision values are defined differently from in the typical PTCM method described above. There are four soft decision variables, which are labeled $g_1$, $g_2$, $g_3$, and $g_4$. Each soft decision value is associated with both coded bit $C_1$ and coded bit $C_2$. The value $g_1$ is a measure of the likelihood that a received (I,Q) values represents a constellation symbol with $(C_1, C_2)=(0,0)$, $g_2$ is a measure of the likelihood that $(C_1, C_2)=(0,1)$, $g_3$ is a measure of the likelihood that $(C_1, C_2)=(1,0)$ and $g_4$ is a measure of the likelihood that $(C_1, C_2)=(1,1)$. One method of calculating this relialility value is the minimum distance method, which like the previously described log-likelihood ratio (LLR) method, results in a maximum likelihood decoder. In the minimum distance method, the values assigned to the soft decisions for a particular (I,Q) pair is the minimum squared distance from the (I,Q) point to the closest constellation point in the coset associated with the soft decision being determined. For the example situation in which there are two coded bits per constellation symbol, there are four cosets. Coset 0 consists of all constellation points with $(C_1, C_2)=(0,0)$; Coset 1 consists of all constellation points with $(C_1, C_2)=(0,1)$; Coset 2 consists of all constellation points with $(C_1, C_2)=(1,0)$; and Coset 3 consists of all constellation points with $(C_1, C_2)=(1,1)$. The soft decision values associated with a received (I,Q) value can be calculated in the following manner $$g_1(I,Q)=\text{minimum over } k \text{ of } [(I-I_{1,k})^2+(Q-Q_{1,k})^2],$$

$$g_2(I,Q)=\text{minimum over } k \text{ of } [(I-I_{2,k})^2+(Q-Q_{2,k})^2],$$

$$g_3(I,Q)=\text{minimum over } k \text{ of } [(I-I_{3,k})^2+(Q-Q_{3,k})^2],$$

$$g_4(I,Q)=\text{minimum over } k \text{ of } [(I-I_{4,k})^2+(Q-Q_{4,k})^2],$$

where $(I_{n,k}, Q_{n,k})$ are the co-ordinates for the $k^{th}$ constellation point in coset n. It for example, the soft decision values are represented by four bits, then a value of 0 for $g_0$ would indicate complete assurance that the received (I,Q) value represents a transmitted symbol with $(C_1, C_2)=(0,0)$, while a value of 15 would indicate an extreme lack of confidence that the received (I,Q) value represents a transmitted symbol with $(C_1, C_2)=(0,0)$. There are methods other than the minimun squared distance method of calculating these soft decisions, the minimum squared distance method is just one example.

Performance Advantage:

As mentioned, the inventive decoding method does not require de-puncturing. As a result, in generating soft decision values all of the coded bits of a TCM symbol can be considered simultaneously, as described above. This leads to performance advantages over the typical PTCM method, in which code rates that involve puncturing require that each coded bit of the TCM symbol be considered separately in the generation of soft decision values.

Figure 12:
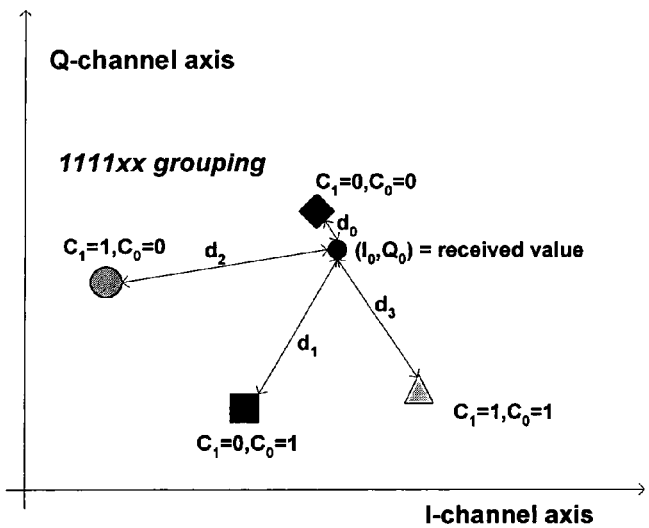
FIG. 12 is a graphical illustration of how the metrics used in the decoder of the invention are superior to the metrics used in a PTCM decoder.

Consider the situation portrayed in FIG. 12. In this figure it is assumed that each TCM symbol has two coded bits and thus the constellation has four cosets and that a rate 3/4 code was used in the encoder. The PTCM decoder would have to use de-puncturing in this situation, and thus it would have to consider each coded bit separately when generating soft decision values. The received (I,Q) value shown on the chart is very close to a coset 0 point, which has coded bits C1=0 and C2=0. The PTCM method would consider, then, that it was very likely that the coded bit C1 was transmitted as a zero and that it was also very likely that coded bit C2 was also transmitted as a zero. Thus, it would determine that a point from coset 0 was the most likely to have been received. It would determine that the received (I,Q) value was very unlikely to have come from coset 3, which does not have any coded bits with a zero value. But since points in coset 1 and coset 2 each have a coded bit that has value 0, the PTCM soft decision generation would determine that the received (I,Q) value was moderately likely to have come from a point from either coset 1 or coset 2, even though the (I,Q) point is relatively far from a point in these cosets. The inventive decoding method does not experience this weakness. Because it can consider both coded bits at the same time it would determine that the received (I,Q) value was very likely to have come from coset 0, but very unlikely to have come from either coset 1, coset 2 or coset 3. As can be seen from this example, the inventive decoding method generates a truer assessment of the likelihoods, which in turn leads to a better BER performance.

Figure 13:
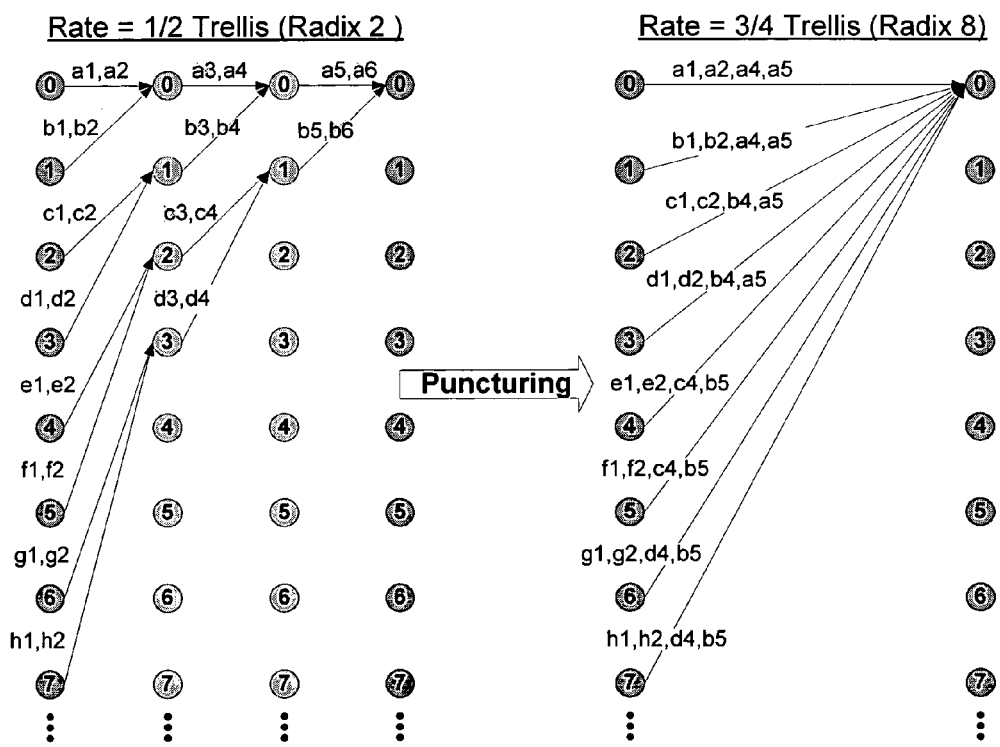
FIG. 13 is a diagrammatical view of a rate 3/4 trellis (radix 8) shown in relation to a rate 1/2 trellis (radix 2).

Full-Rate Trellis Example:

As mentioned above, the inventive decoding method uses a full-rate decoder. This means that the trellis it uses in its Viterbi algorithm is a full-rate trellis. FIG. 13 provides an example of what is meant by this. The figure uses a rate 3/4 convolutional code as an example. The trellis on the left shows a portion of a rate 1/2 convolutional code's trellis. By puncturing the outputs of the encoder, which are shown as labels on the transition branches, a rate 3/4 encoder can be obtained. The trellis on the right shows the equivalent full-rate (which in this case is rate 3/4) trellis. The inventive decoder would use the rate 3/4 trellis in its Viterbi algorithm. Note that on the figure, for the sake of simplicity, only transitions that eventually result in a transition into the zero state have been shown.

This figure illustrates what is meant in the description above by the phrases 'full-rate decoder', or equivalently, 'full-rate trellis'. The figure also illustrates that the inventive decoder can be used with standard PTCM encoders. The inventive decoder would simply use the full-rate trellis that is equivalent to the PTCM encoder's punctured trellis. As a result, if an existing communications link that uses PTCM methods requires a performance improvement, the PTCM decoder could be replaced with a decoder based on the inventive decoding method without having to replace the encoder. This could have a great advantage in situations where the cost of replacing the encoder is prohibitive, such as in satellite down links.

Soft Decision and Branch Metric Calculator:

This section describes an inventive technique for calculating the soft decision and branch metric values for the inventive decoding method. A common practice is to use a large lookup table to store the soft decision or branch metric values associated with a given received (I,Q) value. The use of a lookup table allows the decoder to work with various constellation types since the values stored in the table can be changed to the values required by a new constellation. The innovative method described in this section maintains the flexibility provided by a large lookup table, but greatly reduces the amount of memory storage required.

Figure 14:
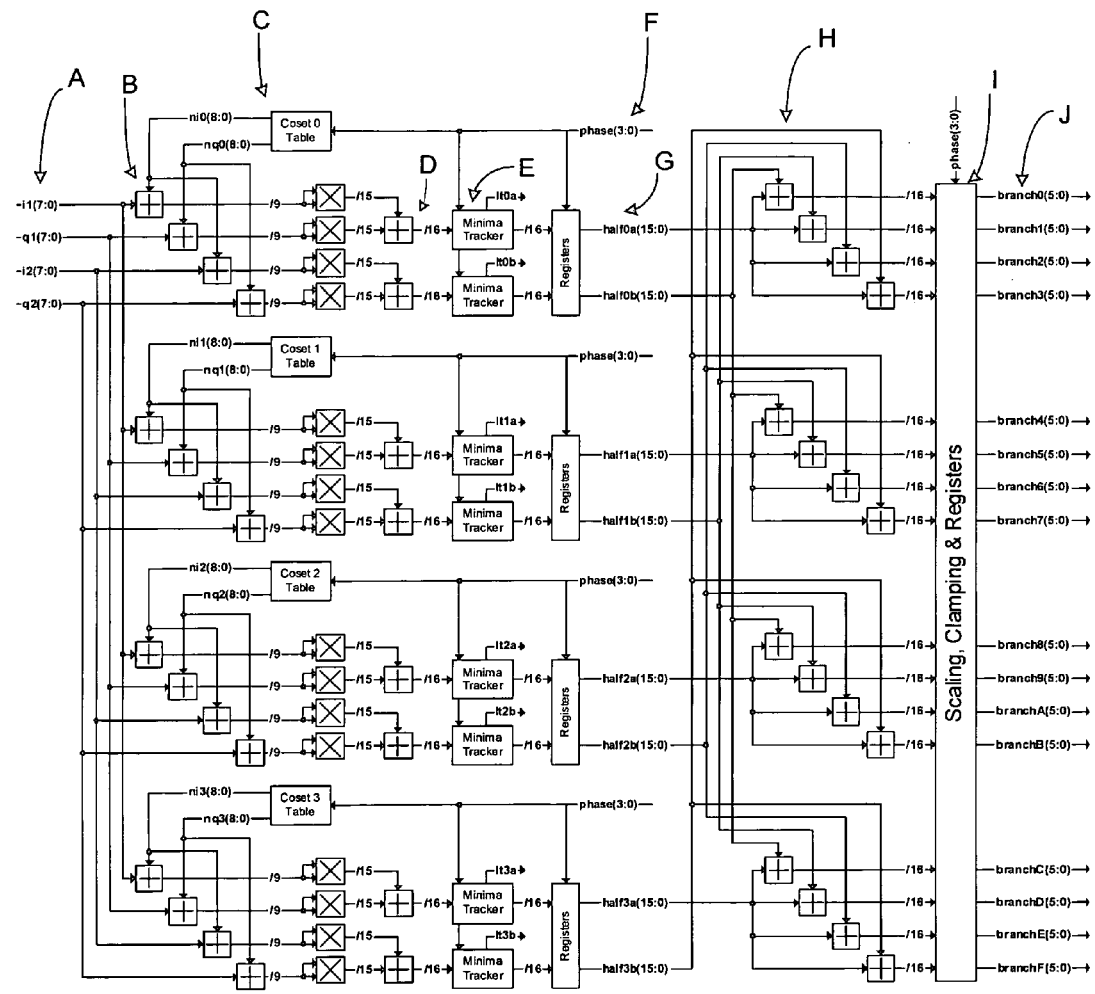
FIG. 14 is a block diagram showing how soft decision values are calculated from received (I,Q) values and then how branch metric values are calculated from the soft decision values.

FIG. 14 provides a block diagram of the innovative soft decision and branch metric calculator. The letters in the following explanation refer to the letters on this diagram. As in the examples throughout this disclosure, it is assumed that the convolutional code rate is 3/4 and that there are two coded bits per constellation symbol (i.e., a 4-dimensional TCM). A rate 3/4 trellis has 4 coded bits per transition, thus in the example under consideration, this corresponds to processing two received constellation symbol values per transition. The two received symbol values enter the calculator at point A. The adders at stage B take in a received (I,Q) value and the co-ordinates for a particular point in a given coset and compute the values: $(I-I_{1,k})$ and $(Q-Q_{1,k})$, where $(I_{n,k}, Q_{n,k})$ are the co-ordinates for the $k^{th}$ constellation point in coset n. The tables at stage C each store the co-ordinates for all the constellation points in a given coset. The phase input to a coset table (point F) plays the role of index k, and steps the table through all of the constellation points in the coset. Stage D squares these values and adds them together to produce the squared distance between the received (I,Q) value and the $k^{th}$ point of the coset. Stage E keeps track of the minimum of these squared distances as each of the constellation points in a coset is examined. At the output of the minima tracker of stage E we have, for each of the two received (I,Q) values, the soft decision values described earlier:

$g_1(I_p, Q_p)$=minimum over $k$ of $[(I_p-I_{1,k})^2+(Q_p-Q_{1,k})^2]$, $g_2(I_p, Q_p)$=minimum over $k$ of $[(I_p-I_{2,k})^2+(Q_p-Q_{2,k})^2]$, $g_3(I_p, Q_p)$=minimum over $k$ of $[(I_p-I_{3,k})^2+(Q_p-Q_{3,k})^2]$, and, $g_4(I_p, Q_p)$=minimum over $k$ of $[(I_p-I_{4,k})^2+(Q_p-Q_{4,k})^2]$, where $(I_{n,k}, Q_{n,k})$ are the co-ordinates for the $k^{th}$ constellation point in coset n, and p denotes which of the two received (I,Q) values is under consideration.

Recall that in the example under consideration each branch in the trellis represents four coded bits. Also, each soft decision value represents the likelihood that the two coded bits took on a certain value. For this reason the calculator forms the branch metrics by combining two soft decisions. As a consequence, the soft decisions for the inventive decoder can also be called half branch metrics.

At the output of stage H, the calculator provides each of the 16 possible branch metric values:

branch_metric$_1$=$g_{1,1}$+$g_{1,2}$ branch_metric$_2$=$g_{2,1}$+$g_{1,2}$ branch_metric$_3$=$g_{3,1}$+$g_{1,2}$ branch_metric$_4$=$g_{4,1}$+$g_{1,2}$ branch_metric$_5$=$g_{1,1}$+$g_{2,2}$ branch_metric$_6$=$g_{2,1}$+$g_{2,2}$ $$\text{branch\_metric}_7 = g_{3,1} + g_{2,2}$$

$$\text{branch\_metric}_8 = g_{4,1} + g_{2,2}$$

$$\text{branch\_metric}_9 = g_{1,1} + g_{3,2}$$

$$\text{branch\_metric}_{10} = g_{2,1} + g_{3,2}$$

$$\text{branch\_metric}_{11} = g_{3,1} + g_{3,2}$$

$$\text{branch\_metric}_{12} = g_{4,1} + g_{3,2}$$

$$\text{branch\_metric}_{13} = g_{1,1} + g_{4,2}$$

$$\text{branch\_metric}_{14} = g_{2,1} + g_{4,2}$$

$$\text{branch\_metric}_{15} = g_{3,1} + g_{4,2}$$

$$\text{branch\_metric}_{16} = g_{4,1} + g_{4,2}$$

Where in the soft decision value, $g_{n,p}$, the n represents the coset value (1 thru 4 in this example) and the p represents which of the two received (I,Q) symbol samples the soft decision value is associated with.

By clamping and scaling, stage I reduces each of the 16 branch metric values down to the desired number of bits used by the Viterbi algorithm section of the decoder. The calculator performs the clamping in the following manner, if a branch metric value exceeds a certain maximum value, then the calculator set the branch metric value equal to that maximum value. The calculator performs the scaling by simply dropping a certain number of the least significant bits. For example, to scale by a factor of $1/8^{th}$, the calculator drops the three least significant bits. The scaling could be done by other methods as well, this in one example.

This method will work with any constellation by simply changing the values stored in the tables for the co-ordinates of the constellation points of a given coset. Since it calculates the soft decision and branch metric values in real time, it allows a high degree of resolution, without requiring large tables that require huge amounts of memory. For example, to achieve with a table the resolution shown in the block diagram of using 9-bit values for the I and Q samples, a table with $2^{18} = 262,144$ entries would be required. This large of a table would be prohibitively large in many instances. When the size of the I and Q samples is increased by one bit, the size of the table used in the lookup table method would quadruple, but for the method outlined above, the size of the adders and multipliers need only increase by one or two bits.

Decoding Algorithm for the Inventive TCM Decoder:

FIG. 15 shows the key components of one configuration of the inventive decoder. The steps for decoding algorithm used by this inventive TCM decoder are as follows:

(1) The I/Q sample data for a received constellation point is again read in from the analog-to-digital converter. For 2-D TCM it would be 1 pair I/Q, for 4-D 2 pair, and for 6-D 3 pair. The diagram shows 2 pair for 4-D TCM.

(2) The soft decision values g1, g2, g3, and g4 are calculated for the received (I,Q) value, as indicated in block 70.

(3) These soft decision values are then used to calculate $c^d$ branch metrics where d is the (TCM dimension)/2 and c is the number of cosets. For a 4-D TCM system using a 3/4 convolutional code having four cosets, as portrayed in the example figure, this would be 16.

(4) These branch metrics are then used in Viterbi decoder 72, to decode n bits at a time at each iteration of the algorithm, where n is the number of bits that were encoded per TCM symbol. For the example situation portrayed in the figure n=3. As a general principal, the inventive method uses a full rate trellis rather than one that requires de-puncturing.

(5) The decoded n bits are re-encoded, as indicated in block 76, and then used, in block 78, along with the I/Q data to make a hard decision decode of the uncoded bits, received through the delay 80, similar to the method used by a PTCM decoder.

(6) The final step, as indicated by block 82, is to assemble the coded bits and uncoded bits to form the final TCM K-bit symbol.

Performance Improvement

Figure 16:
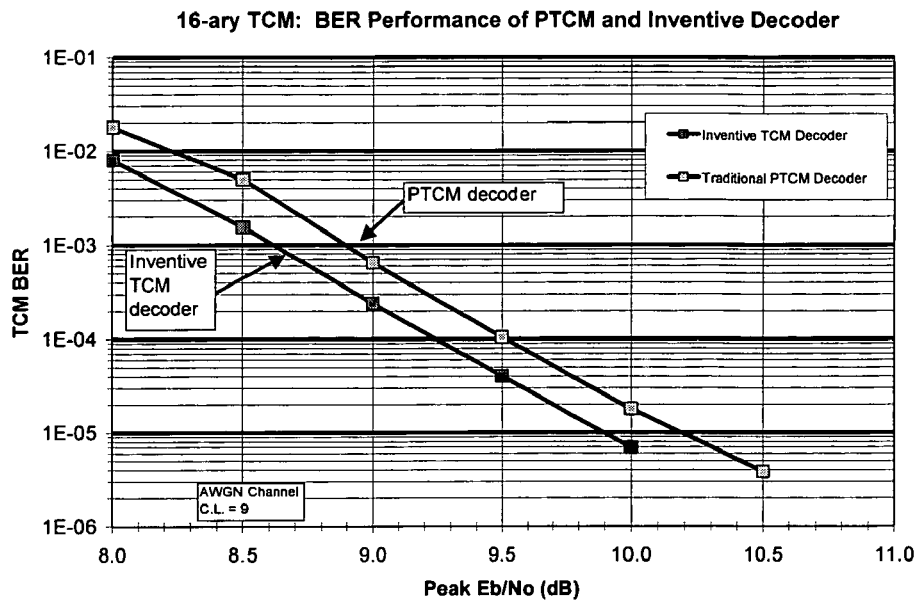
FIG. 16 is a pair of graphs comparing bit error rate (BER) performance for the decoder of the present invention in relation to a conventional PTCM decoder, both used to decode 16-ary TCM data symbols.
Figure 17:
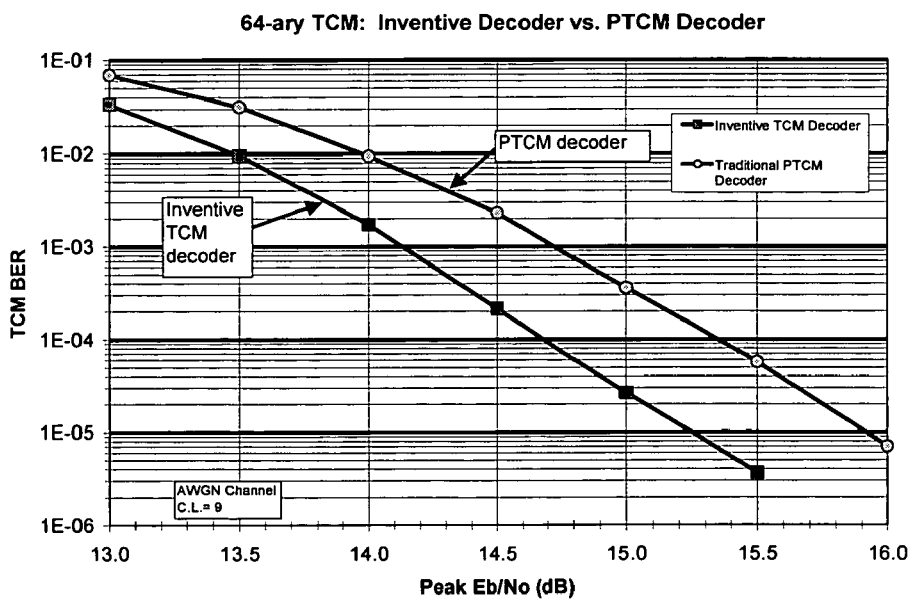
FIG. 17 is a pair of graphs similar to FIG. 16 but with the compared decoders used to decode 64-ary TCM data symbols.
Figure 18:
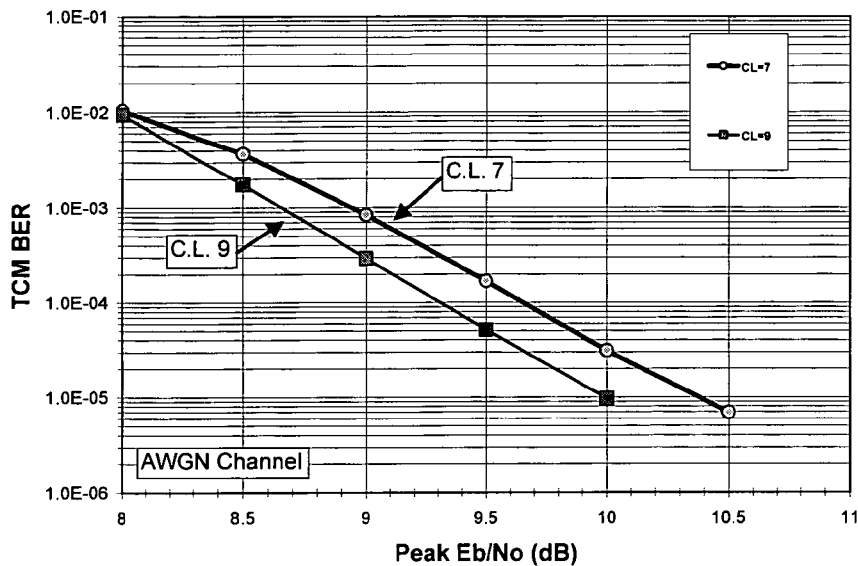
FIG. 18 is a pair of graphs comparing bit error rate (BER) performance for the decoder of the present invention with a constraint length of seven and the same decoder only with a constraint length of nine, both used to decode 16-ary TCM data symbols.
Figure 19:
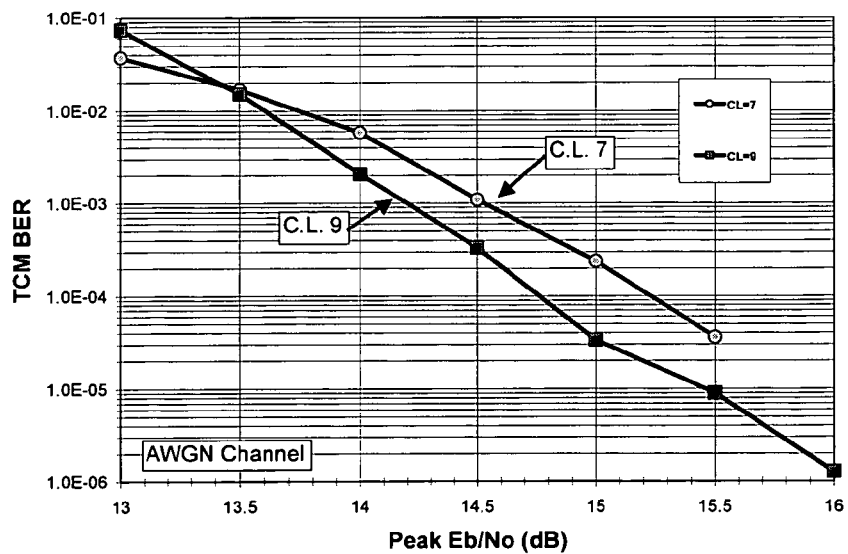
FIG. 19 is a pair of graphs similar to FIG. 18 but with the compared decoders used to decode 64-ary TCM data symbols.

The performance improvement of the inventive TCM decoding technique as compared to the standard PTCM technique is shown in the figures mentioned below for a few different situations. These results were obtained by computer simulation. For the 7/8 TCM 16-ary situation, whose results are shown in FIG. 16, the improvement is about 0.3 dB at a BER of 1E-4. For the 11/12 TCM 64-ary situation, whose results are shown in FIG. 17, the improvement is about 0.6 dB at 1E-4. For the data gathered for both of these figures a constraint length 9 convolutional code was used in both the inventive TCM de PTCM decoder so that the performance improvement due to the inventive decoder's use of a full-rate trellis could be ascertained. FIGS. 18 and 19 show the performance improvement due solely to increasing the constraint length of the convolutional code from 7 to 9. In gathering the data for both of these figures, only the inventive TCM decoder was used. Increasing the constraint length from 7 to 9 improved performance by about 0.4 dB for the 7/8 TCM 16-ary situation and by about 0.5 dB for the 11/12 TCM 64-ary situation.

CONCLUSION:

It will be appreciated from the foregoing that the present invention represents a significant advance in the field of trellis-coded modulation (TCM) and in particular in the decoding of TCM data signals. The invention preserves the relative simplicity of the pragmatic trellis-coded modulation (PTCM) approach of the prior art, but provides a significant performance improvement over PTCM. It will also be appreciated that, although specific embodiments of the invention have been described in detail for purposes of illustration, various modifications may be made without departing from the spirit and scope of the invention. Accordingly, the invention should not be limited except as by the appended claims.

The invention claimed is:

1. A method for decoding data encoded as trellis-code modulation (TCM) symbols, the method comprising the steps of:

receiving the TCM symbols including digital data for a received signal constellation point as one or more pairs of in-phase (I) and quadrature (Q) values;

calculating soft decision values, each of the soft decision values corresponding to each respective received pair of (I,Q) values that defines a set of n least significant bits of received data, where n is the number of bits of data that were subject to convolutional encoding in the TCM encoding process;

calculating multiple branch metric values for use in the decoding process, from the soft decision values;

Viterbi decoding said n least significant bits of data at a time using the multiple branch metric values, and producing n bits at a time of output data;

re-encoding the n bits at a time of output data to determine the coset membership of the received TCM symbols;
using the re-encoded data to process unencoded data bits in a hard decision process to recover multiple uncoded bits of received data; and
assembling the recovered uncoded bits of received data with the n bits of decoded data output from the Viterbi decoding step, to provide a complete data symbol;
and wherein the Viterbi decoding step employs a full rate trellis, without de-puncturing.

2. A method as defined in claim 1, wherein the method further comprises a step of delaying the uncoded bits to synchronize their output with the recovered decoded bits.

3. A method as defined in claim 1, wherein the step of calculating soft decision values comprises calculating a distance corresponding to the minimum of the distances between a received (I,Q) data point and each possible data point in the signal constellation.

4. A method as defined in claim 1, wherein data decoded in accordance with the method was encoded using an encoder with constraint length of at least nine.

5. A method as defined in claim 1, wherein data decoded in accordance with the method was encoded without puncturing.

6. A method as defined in claim 1, wherein:
data received in the receiving step is in the form of two pairs of (I,Q) data, corresponding to a four-dimensional TCM operation;
the step of calculating branch metric values generates $c^d$=sixteen such values, where d is the TCM dimension divided by two, and c is the number of cosets of data, which is four.

7. A method as defined in claim 6, wherein a=3.

8. Digital decoding apparatus for decoding data encoded as trellis-code modulation (TCM) symbols, the apparatus comprising:
means for receiving the TCM symbols including digital data for a received signal constellation point as one or more pairs of in-phase (I) and quadrature (Q) values;
means for deriving soft decision values, each of the soft decision values corresponding to each respective received pair of (I,Q) values that defines a set of a least significant bits of received data, where n is the number of bits of data that were subject to convolutional encoding in the TCM process;
means for calculating multiple branch metric values for use in the decoding process, from the soft decision values;
a Viterbi decoder configured to decode said n least significant bits of data at a time using the multiple branch metric values, to produce n bits at a time of output data;
a convolutional encoder, for re-encoding the n bits at a time of output data to reproduce pairs of values;
means for selecting and processing unencoded data bits in a hard decision process to recover multiple uncoded bits of received data; and
means for assembling the recovered uncoded bits of received data with the n bits of decoded data output from the Viterbi decoder, to provide a complete data symbol;
and wherein the Viterbi decoder employs a full rate trellis, without de-puncturing.

9. Apparatus as defined in claim 8, wherein the apparatus further comprises means for delaying the uncoded bits to synchronize their output with the recovered decoded bits.

10. Apparatus as defined in claim 8, wherein the means for deriving soft decision values comprises means for calculating a distance corresponding to the minimum of the distance between a received (I,Q) data point and each possible data point in the signal constellation.

11. Apparatus as defined in claim 8, wherein data decoded in the apparatus was encoded using an encoder with constraint length of at least nine.

12. Apparatus as defined in claim 8, wherein data decoded in the apparatus was encoded without puncturing.

13. Apparatus as defined in claim 8, wherein:
data received in the apparatus is in the form of two pairs of (I,Q) data, corresponding to a four-dimensional TCM operation;
the means for calculating branch metric values generates $c^d$=sixteen such values, where d is the TCM dimension divided by two, and c is the number of cosets of data, which is four.

14. Apparatus as defined in claim 13, where n=3.

* * * * *